United States Patent [19]

Hennessey

[11] 4,023,878

[45] May 17, 1977

[54] ELECTRICAL COUPLING MEANS

[75] Inventor: William M. Hennessey, Somerville, N.J.

[73] Assignee: Burroughs Corporation, Detroit, Mich.

[22] Filed: Oct. 23, 1975

[21] Appl. No.: 624,737

[52] U.S. Cl. .............................. 339/17 F; 292/87; 339/75 MP

[51] Int. Cl.² .................... H05K 1/12; H01R 13/54

[58] Field of Search ........... 339/17 C, 17 CF, 17 F, 339/39, 91 R, 76–79, 75 R, 75 M, 75 P, 44, 176 MP; 292/87–89, 256, 256.5; 220/326

[56] References Cited

UNITED STATES PATENTS

| | | | |
|---|---|---|---|
| 1,724,362 | 8/1929 | Peterson | 292/87 |
| 1,774,850 | 9/1930 | Snook | 292/89 |
| 2,549,725 | 4/1951 | Uline et al. | 339/44 R |
| 3,149,896 | 9/1964 | Hall | 339/17 F X |
| 3,851,294 | 11/1974 | Palazzetti et al. | 339/17 F |

FOREIGN PATENTS OR APPLICATIONS

| | | | |
|---|---|---|---|
| 1,074,412 | 7/1967 | United Kingdom | 339/91 R |
| 608,625 | 9/1948 | United Kingdom | 339/44 R |

*Primary Examiner*—Roy Lake
*Assistant Examiner*—Neil Abrams
*Attorney, Agent, or Firm*—Kevin R. Peterson; Robert A. Green

[57] ABSTRACT

The disclosure is of an insulating body which is adapted to clamp together a device having contact pads and a multi-wire cable which is to be electrically connected to the contact pads on the device. The body carries a generally U-shaped spring which, when open, permits the device and cable to be coupled together with zero force and, when closed, clamps the device and cable together in intimate engagement.

5 Claims, 7 Drawing Figures

ELECTRICAL COUPLING MEANS

BACKGROUND OF THE INVENTION

In electrical systems, it is often necessary to releasably couple together conductors, from a printed board or the like, and a device, such as a display panel carrying a plurality of contact pads. Various types of apparatus are known for providing such coupling; however, in the use in general of such apparatus, frictional insertion forces are present which can be damaging to contacts and other circuit elements. In addition, such known coupling apparatus does not have relatively simple means for performing the required coupling function.

DESCRIPTION OF THE PREFERRED EMBODIMENTS

Figure 2:
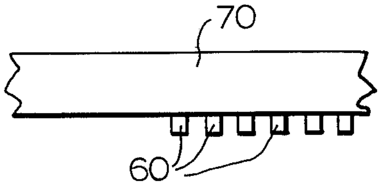
FIG. 2 is a front elevational view of a portion of the panel shown in FIG. 1.
Figure 3:
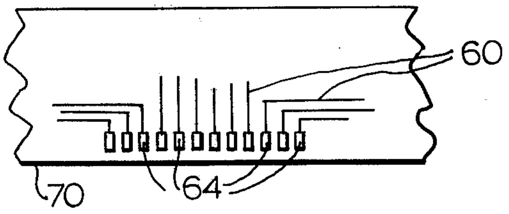
FIG. 3 is a view of the lower surface of the portion of the panel shown in FIG. 2, showing contacts to which electrical connection is to be made.

It will be clear to those skilled in the art that the present invention may be used to couple together two devices, of substantially any type, which are to be releasably held in contact with each other. For purposes of illustration, the connector of the invention 10 is described herein as it relates to making electrical connections to a flat display panel 20 which includes a base plate 30 and face plate 40 sealed together to form a gas-tight envelope. The envelope contains electrodes, not shown, which are connected to conductive runs 60 which extend to contact pads 64 disposed along the front edge of the face plate (FIGS. 2 and 3). A panel of this type is described and claimed in copending application Ser. No. 584,549, filed June 6, 1975.

Figure 4:
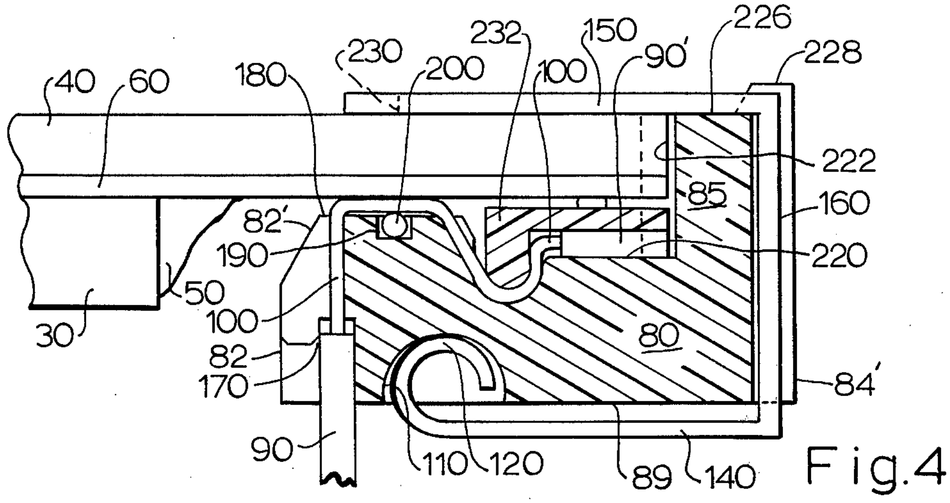
FIG. 4 is an enlarged view, partly in section, of the apparatus of FIG. 1.
Figure 5:
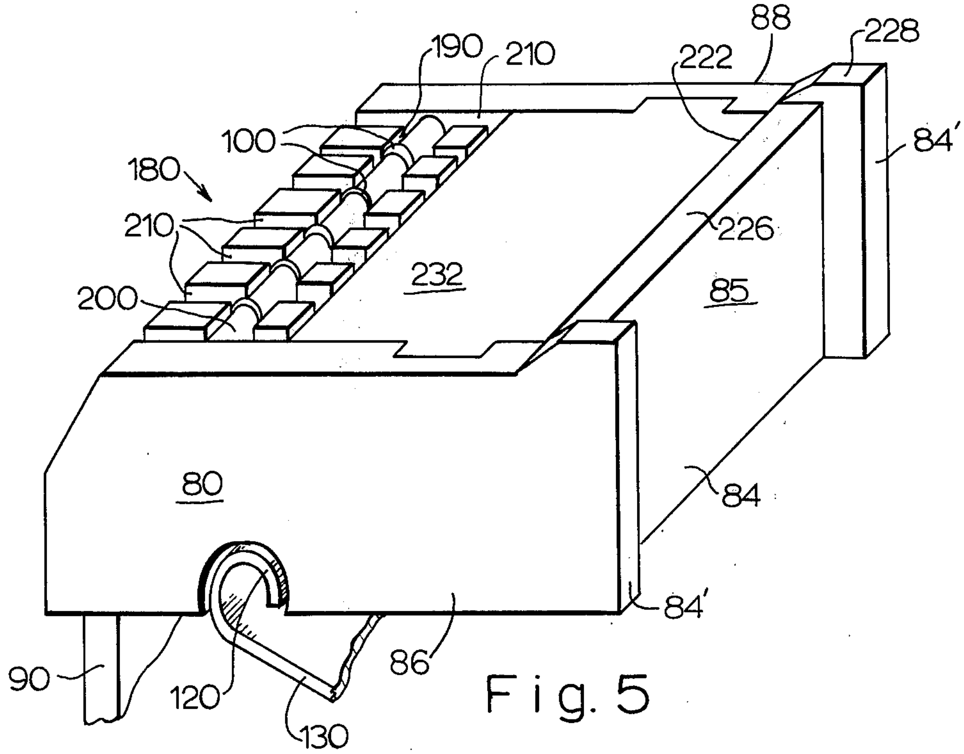
FIG. 5 is a perspective view of a portion of the apparatus shown in FIG. 4.

Referring to FIGS. 4 and 5, the connector 10 includes, as its basic structural element, a body 80 of insulating material having a front wall 82, a rear wall 84, left and right side walls 86 and 88, and a bottom wall 89. The body 80 has a length suitable to accommodate a flat insulated cable 90 having a conductor or wire 100 for each conductive run 60 or contact pad 64 on the face plate 40.

The front portion of the body 80 is provided with a vertical passageway 170 which extends through the thickness of the body from the bottom surface to the top surface and is adapted to receive the cable 90 which may be connected at one end (not shown) to a printed circuit board or the like.

The top surface of the body 80 is irregularly shaped and includes a front flat portion 180 having a transverse slot 190 (FIGS. 4 and 5) which extends across its width and in which is seated an insulating cylinder 200 of a resilient material such as rubber, Neoprene, or the like, on which wires 100 of cable 90 rest, and the inner insulated end 90' of the cable rests on a flat horizontal surface 220 which lies rearwardly of front portion 180 and at a lower level. This end of cable 90 is held in place by a flat plate 232 which is suitably secured in place. The top surface 180 and the top surface of plate 232 are substantially coplanar. The rear portion of the body 80 includes a vertical wall 85 defined by front surface 222 and rear surface or wall 84, and two ribs 84' which extend rearwardly from surface 84 a short distance, and portions 228 thereof project upwardly above the upper surface 226 of wall 84, for a purpose to be described.

Figure 6:
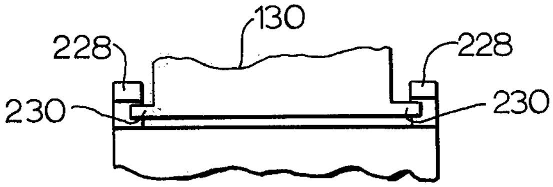
FIG. 6 is a plan view of a portion of the apparatus shown in FIG. 1, illustrating the use of a portion thereof.
Figure 7:
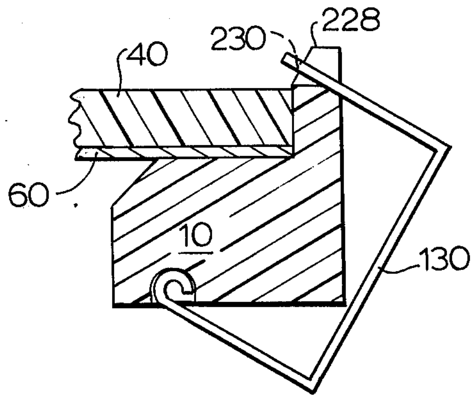
FIG. 7 is a side elevational view, partly in section, of the invention illustrating its use.

According to the invention, a generally L-shaped leaf spring 130 is provided to hold panel 10 and body 80 in secure intimate contact with wires 100 engaging contact pads 64. The bottom wall 89 of the body 80 is provided with a transverse slot 110 which is disposed near the front wall 82 and extends between the side walls 86 and 88 and in which is pivotally disposed the curved end 120 of leaf spring 130. The leaf spring 130 is generally U-shaped and includes two parallel walls 140 and 150 and a connecting wall 160 between them. The curved end 120 of the spring is at the end of wall 140, which lies parallel to the bottom wall 89 of the body 80. The spring wall 160 lies parallel to the rear wall 84 of the body 80, and wall 150 extends adjacent to and generally parallel to the top surface of the body 80. The leading end of wall 150 of the spring is provided with two lateral tabs 230 which engage the upper projections 228 of walls 84' when the spring is in the open position as illustrated in FIGS. 6 and 7.

Figure 1:
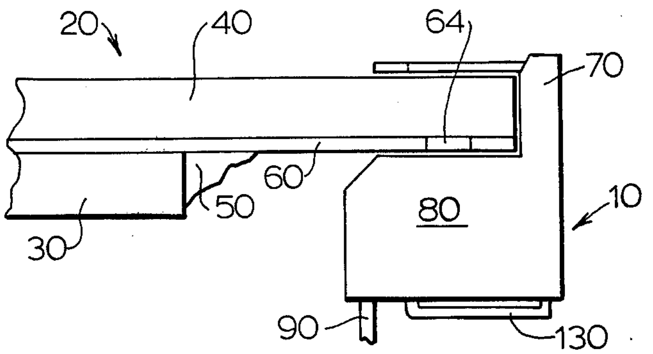
FIG. 1 is a side elevational view of a combination of a display panel and connector embodying the invention.

When the connector and panel are coupled together, the parts are positioned so that each of the cable wires 100 contacts a pad 64 on the panel face plate 40. The front edge 70 of the face plate of the panel is pressed against the vertical surface 222 of rear wall 85 of the connector, and the lower surface of the face plate seats on surface 180 and on the top surface 238 of the plate 232. The insulating body 200 in slot 190 presses the cable conductors 100 firmly against the panel conductors 60 so that good electrical contact is made. With the connector 10 and panel thus properly positioned with respect to each other, the spring 130 is rotated counterclockwise, so that it snaps into place in contact with the top surface of the panel face plate, and thus securely clamps together the connector and panel (FIGS. 1 and 4). To release the parts, spring 130 is rotated clockwise, as seen in FIG. 7, and the panel can be readily removed from the connector.

There are several advantages to the invention. One advantage arises from the fact that, when the connector carrying the cable and the panel are coupled together, the operation is performed with "zero insertion force". As a result, no rubbing or abrasive forces are exerted during assembly of the parts.

In addition, as can be seen from the above description, the spring can be readily assembled to the connector body; it is easy to operate to engage and disengage a panel; and, when in the open disengaged position, the spring is easily held in place by portions of the connector body.

What is claimed is:

1. An electrical assembly for coupling together two devices comprising an insulating body having a top surface, a bottom surface, and a rear surface, said top surface being adapted to support a device to be seated thereon, and a generally U-shaped leaf spring having a first end and a second end and pivotally and detachably coupled at said first end to said bottom surface of said body and adapted to be rotated in a first direction and locked in place engaging said device and pressing said device into engagement with said top surface, said leaf spring having, at said second end, projecting tab portions which engage a cooperating portion formed on said body to prevent said spring from being detached from said body when said spring is rotated in a direction opposite to said first direction to remove it from contact with said device to permit said device to be removed from contact with said body, said spring being generally U-shaped and including a first wall, a second wall, and a third wall, and when said spring is locked in place and couples together a device and said body, said first wall lies parallel to and extends along the greater portion of said bottom surface of said body, said second wall lies parallel to and extends along all of said rear surface of said body, and said third wall lies parallel to and extends along the greater portion of said top surface of said body.

2. The apparatus defined in claim 1 and including a pair of projecting walls which project from said rear surface of said body spaced apart from each other a distance suitable to receive said second wall of said spring between them.

3. An electrical assembly for coupling together two devices comprising an insulating body having a front surface, a rear surface, a top surface, a bottom surface, and two side surfaces, said top surface being adapted to support a device to be seated thereon, a slot having a generally circular cross-section formed in said bottom surface of said body and disposed generally transverse to said side surfaces, a generally U-shaped leaf spring having a first end and a second end, and first, second, and third walls, said first end of said leaf spring being curved and having a generally circular cross-section, said first end being rotatably and detachably seated in said slot, said first wall lying adjacent to said bottom surface of said body, said second wall lying adjacent to said rear surface of said body, and said third wall lying parallel to said top surface of said body when said spring is closed in place and coupling together a device and said body, said second end of said spring having a pair of lateral tabs, a pair of projecting walls which project from said rear surface of said body spaced apart from each other a distance suitable to receive said second wall of said spring between them, said projecting walls having portions which extend above said top surface of said body and engaging said lateral tabs of said leaf spring to prevent said spring from being detached from said body when said spring is rotated in a direction opposite to said first direction to remove it from contact with said device to permit said device to be separated from said body.

4. An electrical assembly for coupling together two devices comprising an insulating body having a top surface, a bottom surface, and a rear surface, said top surface being adapted to support a device to be seated thereon, a pair of projecting walls which project from said rear surface of said body spaced apart from each other a distance suitable to receive said spring between them, said projecting walls having portions extending above said top surface of said body, a generally U-shaped leaf spring having a first end and a second end and pivotally and detachably coupled at said first end to said bottom surface of said body and adapted to be rotated in a first direction and locked in place engaging said device and pressing said device into engagement with said top surface, said leaf spring having, at second end, projecting tab portions which cooperatively engage said portions of said projecting walls, which extend above said top surface of said body, to prevent said spring from being detached from said body when said spring is rotated in a direction opposite to said first direction to remove it from contact with said device to permit said device to be removed from contact with said body.

5. An electrical assembly for coupling together two devices comprising an insulating body having a top surface, a bottom surface, a front surface, and a rear surface, said top surface being adapted to support a device to be seated thereon, and a generally U-shaped leaf spring having a first end and a second end, said first end being pivotally and detachably coupled to said bottom surface of said body at a location between said front surface and said rear surface of said body, said entire spring being adapted to be rotated in a first direction, about its first end, and locked in place engaging said device and pressing said device into engagement with said top surface, said leaf spring having, at said second end, means which engage a cooperating portion formed on said body to prevent said spring from being detached from said body when said spring is rotated in a direction opposite to said first direction to remove it from contact with said device to permit said device to be removed from contact with said body, said means comprising projecting tabs at said second end of said spring, and said portion of said body comprises portions which project from a wall thereof.

* * * * *